10/23/84 OR 4,479,069

United States Patent [19]

Miller

[11] Patent Number: 4,479,069

[45] Date of Patent: Oct. 23, 1984

[54] LEAD ATTACHMENT FOR AN ACOUSTIC TRANSDUCER

[75] Inventor: David G. Miller, Boxford, Mass.

[73] Assignee: Hewlett-Packard Company, Palo Alto, Calif.

[21] Appl. No.: 320,377

[22] Filed: Nov. 12, 1981

[51] Int. Cl.[3] ............ H01L 41/22

[52] U.S. Cl. ............ 310/334; 310/327; 339/17 F

[58] Field of Search ............ 310/334, 335, 337, 348, 310/366, 326, 364, 327, 353; 174/117 F, 117 FF; 339/17 F, 176 MF

[56] References Cited

U.S. PATENT DOCUMENTS

| | | | |
|---|---|---|---|
| 3,248,779 | 5/1966 | Yuska et al. | 339/17 F |
| 3,818,415 | 6/1974 | Evans et al. | 339/17 F |
| 3,952,387 | 4/1976 | Iinuma et al. | 29/25.35 |
| 4,240,003 | 12/1980 | Larson | 310/334 |
| 4,277,712 | 7/1981 | Hanafy | 310/334 |
| 4,381,470 | 4/1983 | Leach et al. | 310/327 |

*Primary Examiner*—J. D. Miller
*Assistant Examiner*—D. L. Rebsch
*Attorney, Agent, or Firm*—Donald N. Timbie

[57] ABSTRACT

An acoustic transducer having a crystal stack or crystal stacks forming shelves, and leads adhered to a flexible sheet having an opening that fits over the part of the stack that extends above the shelves so as to permit the leads to be aligned with and make electrical contact with the respective crystals.

3 Claims, 3 Drawing Figures

LEAD ATTACHMENT FOR AN ACOUSTIC TRANSDUCER

BACKGROUND OF THE INVENTION

An acoustic transducer is generally formed of a plurality of stacks of planar piezoelectric crystals mounted in spaced parallel overlapping relationship. Electrical leads respectively in contact with one side of the crystals are used to apply electrical signals to the crystals so as to cause them to transmit acoustic energy and to conduct the electrical signals generated by the crystals in response to their reception of acoustic energy.

It is possible to bond each lead to a different crystal, but the dimensions are generally so small that this is tedious and expensive and runs the risk of short circuits between crystals.

In a U.S. Pat. No. 4,404,489, "Method and Means for Producing an Acoustic Transducer", filed on Nov. 3, 1980, the names of John D. Larson III and David George Miller and assigned to Hewlett-Packard Company, as is this application, a technique for attaching the leads is described wherein a flexible circuit board having the leads adhered thereto is mounted with the leads aligned with the individual crystals and bonded thereto. One of the problems with this structure is the fact that the circuit board material is in the path of the acoustic waves being transmitted and received and has such acoustic properties as to reduce the effectiveness of the transducer.

BRIEF DESCRIPTION OF THE INVENTION

The transducer includes, as before, a plurality of piezoelectric crystals mounted in spaced parallel overlapping relationship, but in accordance with this invention, there is at least one shelf that runs across the crystals. As a result, the cross-section of the crystals parallel to and on one side of the shelf is smaller than a cross-section that is parallel to and on the other side of the shelf.

An opening corresponding to the size and shape of the smaller of said cross-sections is formed in a sheet of flexible non-conducting material and leads on at least one side of the opening are adhered to one side of the sheet. The sheet is mounted so that the smaller cross-section of the stack extends through the opening and the leads are respectively aligned with the parts of the crystals forming the shelf. Electrical connection between the leads and the crystals, as well as physical adherence thereto, may be attained by placing a conductive epoxy between the sheet and the shelf. The crystals are generally formed by sawing a block of crystal. Thus, if the sheet with the leads is mounted before the sawing, the conductive epoxy is removed from between the crystals by the saw; and if the sheet if mounted after the sawing, it can be removed with a saw. A distinct advantage of the structure is that alignment of leads and crystals is automatic if the opening in the sheet carrying the leads closely conforms to the smaller cross-section referred to. Another advantage is that the plastic to which the leads are adhered is not in the acoustic path.

DETAILED DESCRIPTION OF THE INVENTION

Figure 1:
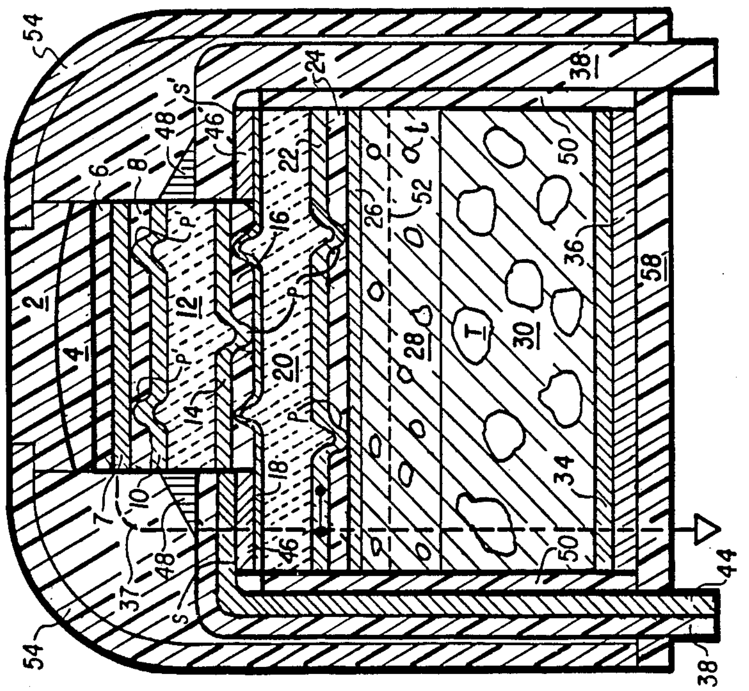
FIG. 1 is a cross-section of all the components of the transducer assembly.

In FIG. 1, a hard outer layer 2 having a longitudinally concave inner surface forms a lens with a soft urethane material 4 that is deposited between the concave surface and a film 6 of 0.25 mil mylar so as to form an acoustic lens in accordance with the teachings of U.S. Pat. No. 4,387,720, entitled "Transducer Acoustic Lens", filed on Dec. 29, 1980, in the name of David G. Miller.

The underside of the mylar film 6 is coated with a film of gold, as indicated at 7 and a layer 8 of non-conductive epoxy lies between the the film 7 and a conductive coating 10 of gold on the upper surface of an array of crystals 12 shown in side view. The coating 10 can be formed from successive depositions of chromium and gold. In fabrication, the mylar film 6, the epoxy layer 8 and the upper surface of the crystal 12 are brought into intimate contact by pressure that may be applied by placing the combination between two bladders filled with air under pressure. Even though the upper surface of the crystal 12 is lapped and polished to a surface finish of better than one micron, there are a small number of high points such as indicated at the P's to penetrate the layer 8 of non-conductive epoxy and make electrical contact with the gold film 7. For purposes of illustration, the dimensions of the high points P are greatly exaggerated. Prior to the fabrication, the crystals 12 are, of course, in the form of a solid block.

The underside of the crystals 12 is the same as the upper surface and has a coating 14 of gold deposited thereon. A layer 16 of non-conductive epoxy is mounted between the gold coating 14 and a similar gold coating 18 on the top surface of a crystal 20. Electrical contact between the gold films 14 and 18 is achieved by the high points P penetrating through the layer 16 of non-conductive epoxy. The crystal 20 is adhered to the crystal 12 by the use of bladders filled with pressurized air as previously explained.

Note that the crystal 20 is wider than the crystal 12 so as to form a combination stack of crystals having shelves S and S' on opposite sides thereof. The reason for using two layers of crystals 12 and 20 is to cancel unwanted low frequency modes as described in U.S. Pat. No. 4,240,003, issued Dec. 16, 1980, which is assigned to Hewlett-Packard Company.

The bottom of the crystal 20 also has a film 22 of gold, and a layer 24 of non-conductive epoxy is mounted between the gold film 22 and a sheet 26 of thin copper foil. For reasons set forth in "Stratified Particle Absorber", U.S. Pat. No. 4,381,470, filed on Dec. 24, 1980, in the names of Jerry G. Leach and James T. Fearnside, the thin copper foil 26 is mounted on the upper surface of an acoustic backing having an upper portion 28 composed of vinyl and small tungsten particles t that can be more easily cut with a saw and a lower portion 30 composed of vinyl and larger tungsten particles T that provide better acoustic absorption. As explained in U.S. Pat. No. 4,384,228, entitled "Acousto-Electric Transducer", filed on Dec. 18, 1980, in the name of J. Fleming Dias, which is also assigned to Hewlett-Packard Company, it is important that the upper surface 28 of the backing be lapped so as to remove any excess vinyl. A layer 34 of conductive epoxy is used to adhere copper foil 36 to the bottom 30 of the acoustic backing, and the backing is pressed toward the crystals 20 with bladders. An insulated conductor 37 is connected to the film 7 and the film 22 and adhered in any suitable manner to the crystals 12, 20 and the acoustic backing 28, 30.

Figure 2:
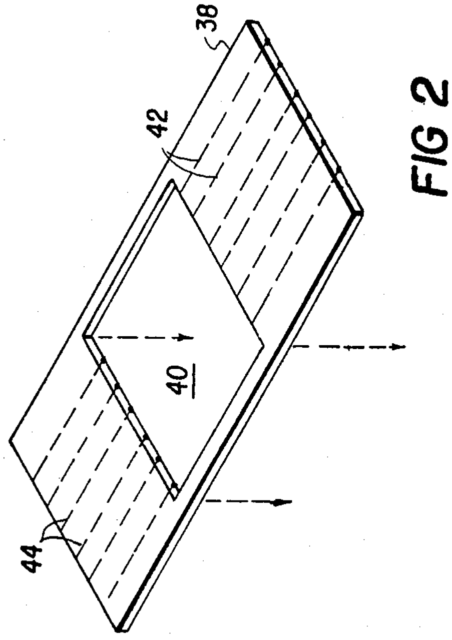
FIG. 2 is a top view of the sheet having the leads attached thereto and also shows the tops of the crystals.
Figure 3:
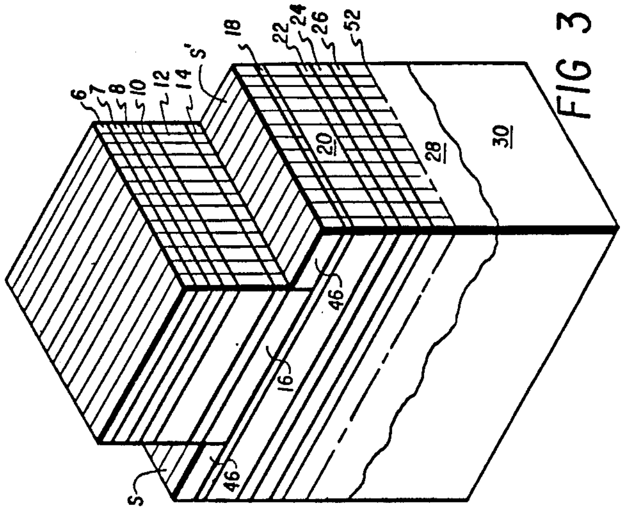
FIG. 3 is a three-dimensional view of a stack of crystals.

Attaching the leads to the faces of the respective crystals comprising S, S' is achieved as follows. As seen in FIG. 2, a sheet 38 of flexible insulating material such as is available under the trademark "Kapton" is provided with an opening 40 that closely corresponds in shape and dimension to the cross-section of the crystals 12 in FIG. 3. As indicated by the parallel dashed lines 42 and 44, leads are formed in any suitable manner on the underside of the sheet 38 on opposite sides respectively of the opening 40, as shown. The leads 42 and 44 are actually on the underside of the sheet 38 as viewed in FIG. 2. In order to space the leads farther apart, the leads 42 are aligned with alternate crystals, and the leads 44 are aligned with crystals in between the alternate crystals, but leads that are respectively aligned with each crystal could be on one side of the opening 40. In order to conductively adhere the leads 42 and 44 to the gold surface 18 on the top of the crystals 20, a conductive epoxy 46 is placed on top of the gold surface 18 on the shelves S and S', FIG. 3 and the portion of the sheet 38 in registration with the faces of the crystals on the shelves is pressed against them. In order to make a stronger bond, a non-conductive epoxy 48 is applied to the top of the sheet 38 as shown in FIG. 1. The sheet 38 with its leads 42 is bent downward at the outer portion of the shelf S so as to be parallel to the sides of the crystal stack 20 and the acoustic backing 28, 30. Because the latter is conductive, a layer 50 of non-conductive epoxy is used to adhere the sheet 38 to the sides of the crystal stack 20 and the acoustic backing 28, 30.

At this point, all components, films or coatings from the mylar film 6 to the foil 36 have been compressed together so as to form a unitary structure. Formation of the individual crystals of each stack is achieved by cutting through the mylar film 6 and all the way through the structure into the upper portion 28 of the acoustic backing to a point such as indicated by the dash-dot line 52. The reason for cutting into the backing is to reduce the ringing of the crystals for reasons described in U.S. Pat. No. 4,277,712 entitled "Acoustic Electric Transducer with Slotted Base" which issued July 7, 1981, to Amin M. Hanafy and which is assigned to the Hewlett-Packard Company.

Final assembly is accomplished as follows. A cup 54 of insulating hard shock-resistant plastic, shown in FIG. 1, is inverted and the hard lens member 2 is adhered to the inside of it so as to be centered with respect to the opening 56, which although not shown is rectangular. The unitary structure from the mylar film 6 to the foil 36 inclusive is placed in the cup 54 with the mylar film 6 properly spaced from the lens member 2, and liquid urethane is then poured into the cup 54 until it reaches the level of the copper foil 36 and is then allowed to harden. A cover 58 having openings so as to permit the passage therethrough of the ends of the sheet 38 with the associated leads 42 and 44 and the conductor 37 is mounted so as to close the larger opening of the cup 54. In operation, signals are applied to and received from the leads 42 and 44 and the outer surfaces of the crystal stacks 12 and 20 are connected to ground by the conductor 37.

The purposes of the various coatings, foils, films and structures are as follows.

Hard outer layer 2:

(a) Give the array a fixed elevation focusing.

(b) Prevent anything from the outside world from getting into the crystals of the stack, shorting them out.

(c) Provide an electrically insulating layer between the patient and the crystals.

(d) Act as a shock mounting structure to prevent the crystal from fracturing in the event the arrays undergo mechanical shock.

(e) Suppress grating lobes, because the critical angle of the lens is about 55 degrees.

Soft layer 4:

(a) Layer 4 in conjunction with layer 2, provide the elevation focusing action.

(b) Being soft, the material of layer 4 can be deformed so as to keep the deacceleration forces low enough to prevent mechanical damage to the crystal stack.

Mylar layer 6:

(a) Provide a barrier against RFI interference.

(b) Prevent liquid urethane from filling up the saw cuts between elements, thereby increasing cross coupling and degrading array performance.

(c) Provide mechanical stiffening of the piezoelectric elements to improve array impact resistance.

(d) Electrically connect the top side of all elements together and to ground.

Chromium and gold depositions 10, 14, 18 and 22:

(a) Provide a conductive plane on each surface of each crystal so as to insure a uniform electric field across each crystal and hence produce uniform contractile forces across each crystal, thereby minimizing unwanted oscillatory modes.

(b) The gold on top of the crystal stack 20 provides a conductive plane out to landing pad areas S and S' where element connections are made.

Layer 26:

(a) Layer 26 is a 0.7 mil copper foil whose acoustic impedance matches the acoustic impedance of the crystal stacks 12, 20 and the acoustic backing 28. Its purpose is to provide a conductive ground plane for the crystal stacks 12 and 20.

What is claimed is:

1. A transducer assembly including a first array of parallel crystals, a second array of parallel crystals having faces respectively adhered to the faces of the crystals of the first array with the faces of the crystals of said first array protruding beyond the faces of the crystals of the second array so as to form at least one shelf, electrical conductors respectively in contact with the adhered faces of the crystals of each array, the said conductors respectively extending along the faces of said first array that form said shelf, and a sheet of insulating material having means defining an opening therein, said opening closely fitting around the second array at the point where the faces of its crystals are adhered to the faces of the crystals of said first array, said sheet carrying separate electrical conductors that are respectively in contact with the electrical conductors on the faces of the crystals of said first array that form said shelf.

2. A transducer assembly as set forth in claim 1 wherein two shelves are formed and wherein said electrical conductors on one side of said opening are aligned with alternate crystals and the electrical conductors on the other side of said opening are aligned with crystals between said alternate crystals.

3. A transducer assembly as set forth in claim 1 wherein the insulating material of said sheet is flexible so that it can be bent over the ends of the crystals of said first array.

* * * * *